United States Patent [19]

Ohnuki et al.

[11] Patent Number: 4,668,332
[45] Date of Patent: May 26, 1987

[54] METHOD OF MAKING MULTI-LAYER PRINTED WIRING BOARDS

[75] Inventors: Hidebumi Ohnuki; Toshiaki Asano; Takashi Atarashi; Sunao Yasui, all of Tokyo, Japan

[73] Assignee: NEC Corporation, Tokyo, Japan

[21] Appl. No.: 727,634

[22] Filed: Apr. 26, 1985

[30] Foreign Application Priority Data

Apr. 26, 1984 [JP] Japan .................................. 59-84576

[51] Int. Cl.⁴ ............................ C23F 1/02; B44C 1/22; C03C 15/00; C03C 25/06
[52] U.S. Cl. ...................................... 156/630; 29/846; 29/852; 156/634; 156/656; 156/659.1; 156/902; 174/68.5; 361/414
[58] Field of Search ................. 29/841, 846, 848, 852, 29/855, 856, 858; 156/629, 630, 634, 656, 659.1, 661.1, 901, 902; 427/96–98; 430/313, 318; 174/68.5; 361/414

[56] References Cited

U.S. PATENT DOCUMENTS 3,351,702 11/1967 Stephens ......................... 156/630 X Primary Examiner—William A. Powell
Attorney, Agent, or Firm—Sughrue, Mion, Zinn, Macpeak, and Seas

[57] ABSTRACT

A multi-layer printed wiring board in which an internal board has a wiring pattern on both sides. Two conductive plates for establishing respective voltage planes are formed with a pattern of grooves to match the wiring pattern of the internal board. The internal board is then sandwiched to the two sides of the conductive plates, with the grooves registering with the wiring pattern, and with intermediate insulating layers. Further, insulated wiring patterns are formed on the exterior sides of the conductive plates together with through-holes through the assembly.

6 Claims, 28 Drawing Figures

 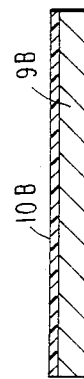 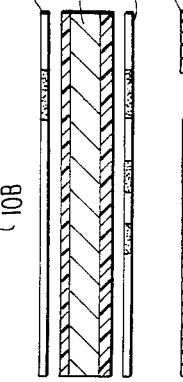 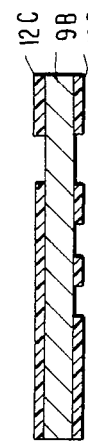  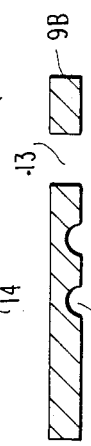 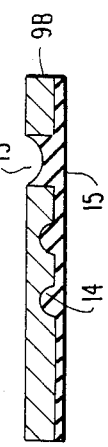
FIG.3A FIG.3B FIG.3C FIG.3D FIG.3E FIG.3F FIG.3G
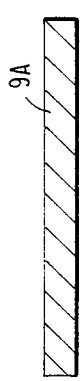 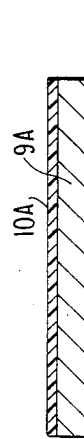 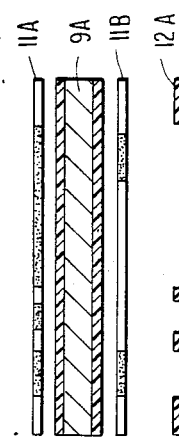 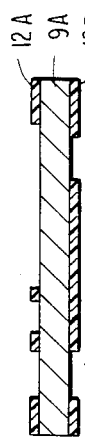 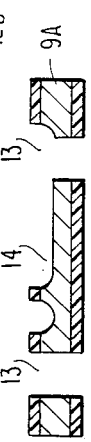 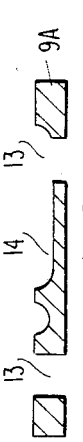 
FIG.2A FIG.2B FIG.2C FIG.2D FIG.2E FIG.2F FIG.2G

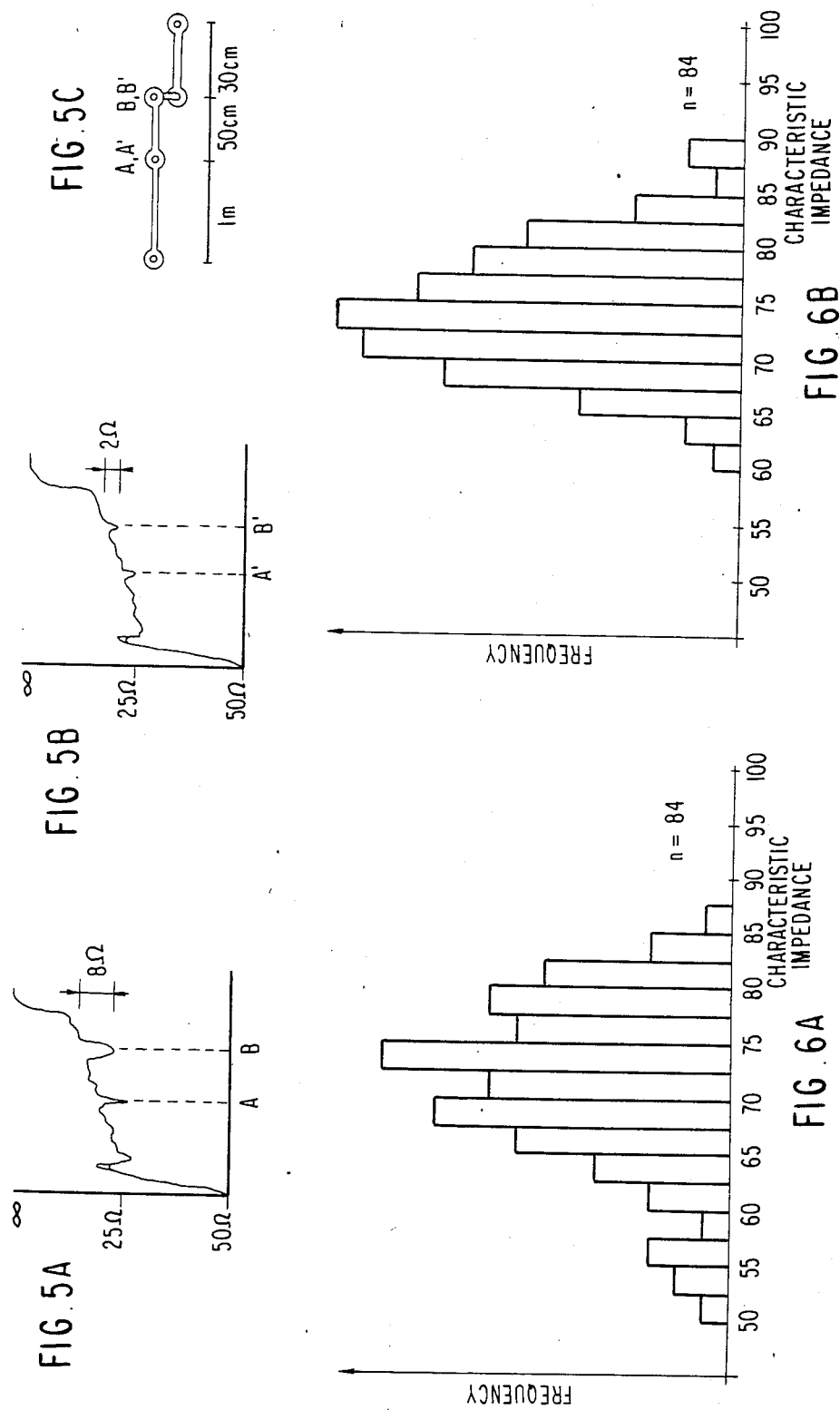

METHOD OF MAKING MULTI-LAYER PRINTED WIRING BOARDS

BACKGROUND OF THE INVENTION (1) Field of the Invention

The present invention relates to a multi-layer printed wiring boards (PWB) and more particular, to a method of making multi-layer PWB suitable for use in an up-to-date electronic equipment requiring high-speed operation.

(2) Description of the Prior Art

A multi-layer PWB has found application in variety of electronic equipment, such as computers, electronic switching system and so on. As is well known, in the field of the high-speed pulse circuits, impedance matching is required at the transmitting end for transmitting pulses, a signal line for propagating the pulses and receiving end for receiving the pulses. Otherwise, a spurious signal called "ringing" would be generated in a pulse waveform. In a logic network in which a plurality of pulse waveforms are combined and processed, the above-mentioned ringing causes abnormal operation by the generation of hazard (whisker-shaped pulses) due to deviation in relative timing between the respective pulses. Especially in equipment using super high-speed devices called ECL (Emitted Coupled Logic) or CML (Current Mode Logic) connected with a multi-layer PWB, fluctuations of a characteristic impedance of a signal line of the multi-layer PWB should be made as small as possible to facilitate the design of the equipment.

FIGS. 1A to 1C show a conventional process for making a conventional multi-layer PWB in cross-sectional views, where an internal printed wiring board 20 is sandwiched between a pair of external printed wiring boards 100. The internal PWB 20 has a structure such that a pair of circuit patterns 22 and 24 are provided on principal surfaces of an insulative plate 2. These circuit patterns 22 and 24 are electrically connected via a through-hole 23. In the first step, as shown in FIG. 1A, external substrates 1 have outer conductive layers 102 on the outside surfaces, respectively. Internal surfaces of the substrates 1 are provided with inner conductive layers 101, respectively. Each of the inner conductive layers 101 has a predetermined pattern so as to form a ground layer or power layer by using a photoetching process or the like. In a process of laminating three PWBs, a necessary number of insulative sheets such as prepreg sheets 3 are interposed between the internal PWB 20 and inner conductive layers 101, respectively. The resultant laminated structure is then drilled at desired position to form through-holes 5. Thereafter, inside surfaces of the through-holes 5 and outer conductive layers 102 are subjected to plating to form through-hole plating layers 6 as shown in FIG. 1B. Then, as shown in FIG. 10 external circuit patterns 7 are formed respectively through a photo-etching process. In this example, a multi-layer PWB 8 of six conductive layers is achieved as shown in FIG. 1C.

In a conventional multi-layer PWB, however, it is difficult to keep the principal surfaces of internal conductive layers 101 in a flat state parallel to the principal surfaces of internal PWB 20. As is shown in FIGS. 1B and 1C, the internal conductive layers 101 tend to wave. Such a waved circuit pattern causes undesirable fluctuations of a characteristic impedance of a signal line of the internal PWB 20.

Another important factor for the fluctuation of the characteristic impedance of a signal line is the width of circuit pattern. When an internal PWB 20 has a through-hole 23 with a land 25, the difference in width of the land 25 and the signal line connected thereto causes a large fluctuation of characteristic impedance. The influence of the difference in width becomes more significant when the signal pattern is located near a ground layer or power layer which extends over the entire area of a multi-layer PWB. When the fluctuation of characteristic impedance becomes large it becomes difficult to design equipment for high-speed operation.

SUMMARY OF THE INVENTION

It is therefore one object of the present invention to provide a multi-layer PWB which is free from the above-mentioned disadvantages in the prior art.

A more specific object of the present invention is to provide a normal structure and a method of making a multi-layer PWB which has a stable characteristic impedance.

Another specific object of the present invention is to provide a novel process for making a multi-layer PWB, which process can eliminate fluctuations of charcteristic impedance of the produced multi-layer PWB and which process facilitates circuit design.

According to one feature of the present invention, there is provided a multi-layer printed wiring board comprising: an internal printed wiring board having first and second circuit patterns formed on first and second principal surfaces of an insulative plate, respectively, first and second patterns being electrically connected with each other via a through-hole formed in the insulative plate, a pair of conductive layers sandwiching the wiring board, each of first principal surfaces opposing said circuit pattern having a pattern of grooves corresponding to the circuit pattern facing thereto, a pair of first insulative members sandwiched between the wiring board and the pair of conductive layers, respectively, so as to fill the gaps therebetween, and thereby making opposing principal surfaces parallel, a pair of second insulative members provided on second principal surfaces of the pair of conductive layers, respectively, and a pair of external circuit patterns provided on the pairs of second insulative members.

According to another feature of the present invention, there is provided a method of making a multi-layer printed wiring board comprising the steps of: preparing a printed wiring board having first and second circuit patterns formed on first and second principal surfaces of an insulative plate, respectively, the first and second patterns being electrically connected with each other via a through-hole formed in the insulative plate, forming a pair of pattern of grooves on a first principal surfaces of a pair of conductive layers in such manner that the pattern of grooves corresponds to the patterns of the first and second circuit patterns, respectively, depositing an insulating material on each of the first principal surfaces of said pair of conductive layers so as to make each of said first principal surfaces flat with the insulating material, sandwiching the printed wiring board between the pair of conductive layers in such manner that each of said pattern of grooves is opposed to corresponding pattern of the circuit patterns before the insulating material is made to be harden state, forming a pair of insulative layers on second principal surfaces of the pair of conductive layers, respectively, and forming a pair of external circuit patterns on the pair of insulative layers, respectively.

The above-mentioned and other features and objects of the present invention will become apparent in the following description of one preferred embodiment of the invention taken in conjunction with the accompanying drawings.

BRIEF DESCRIPTION OF THE DRAWINGS:

FIGS. 2A to 2G, FIGS. 3A to 3G and FIGS. 4A to 4F jointly illustrate cross-sectional views of the successive steps in the process for making a multi-layer PWB according to the present invention.

FIGS. 5A and 5B show measured waveform of characteristic impedances of conventional structure and the present invention, respectively.

FIG. 5C shows an experimental pattern used for measuring waveforms of shown in FIG. 5A and FIG. 5B.

FIG. 6A and FIG. 6B show a histogram for characteristic impedance measured in a conventional structure and the present invention, respectively.

DESCRIPTION OF THE INVENTION

FIG. 2A and FIG. 3A show cross-sectional views of a pair of conductive fibers or thin plates 9A and 9B for ground layers or power layers, respectively, consisting of, for example, copper foils having a thickness of 150 $\mu$m or more.

Subsequently, photosensitive resin layers 10A and 10B made of, for instance, RISTON ® dry film #1220 manufactured by Dupont Company are formed through deposition on the both upper and lower surfaces of these conductive films 9A and 9B, respectively, as shown in FIG. 2B and FIG. 3B. Still further, the photosensitive resin layers 10A and 10B are exposed to light through photo-masks 11A, 11B, 11C and 11D as shown in FIG. 2C and FIG. 3C. Unexposed portions of the photosensitive resin layers 10A and 10B are dissolved away by making use of a solvent such as, for example 1.1.1-trichloroethane or the like, and thereby etching resist films 12A, 12B, 12C and 12D are formed as shown in FIG. 2D and FIG. 3D. At this moment, in the case of providing through-holes 13 in the conductive films 9A and 9B, mask-openings are formed at the same positions, that is, at the same horizontal positions of the paired photo-masks 11A–11B and 11C–11D, whereas in the case of providing grooves 14, mask-openings are formed only in one photo-mask of each of the paired photo-masks 11A–11B and 11C–11D.

Next, the portions of the both surfaces of the conductive films 9A and 9B are not covered by the etching resist films 12A, 12B, 12C and 12D are etched away by means of a solution of cupric chloride or the like, and thereby the through-holes 13 and the grooves 14 are formed as shown in FIG. 2E and FIG. 3E.

Thereafter, the etching resist films 12A, 12B, 12C and 12D are removed by means of a solution of methylene chloride to provide grooved conductive films 9A and 9B as shown in FIG. 2E and 3F.

Then insulator resins layer 15 are formed on the surfaces of the conductive layers 9A and 9B where the grooves 14 are present, by making use of the technique of screen printing, roll coating, or the like to provide grooved conductive films with insulating coatings as shown in FIG. 2G and FIG. 3G.

Figure 1A:
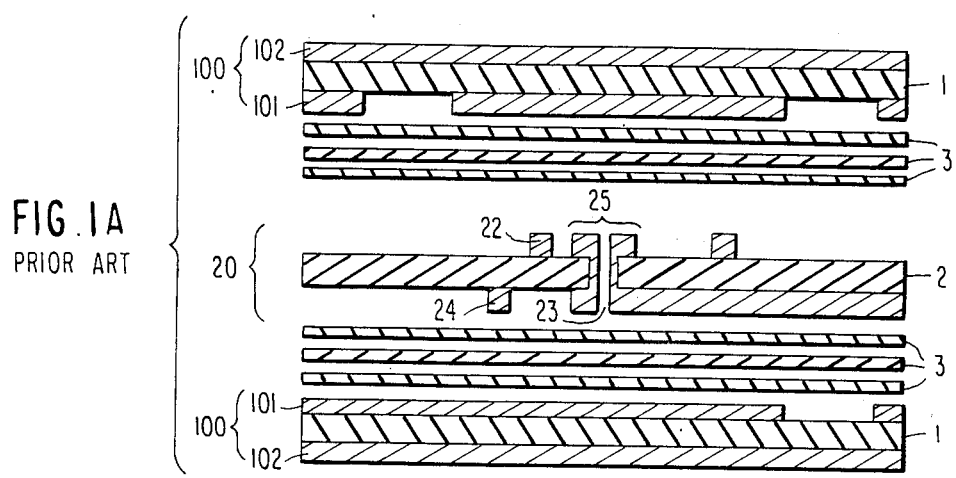
FIGS. 1A to 1C illustrate cross-sectional views of the successive steps in the process for making a multi-layer PWB in the prior art.
Figure 1B:
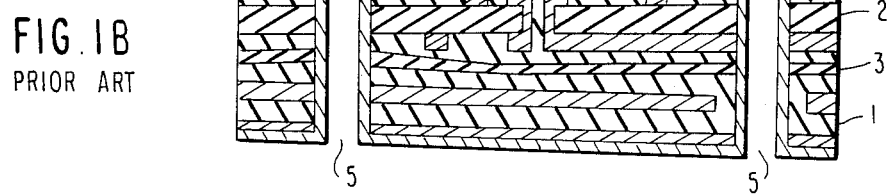
Figure 4A:
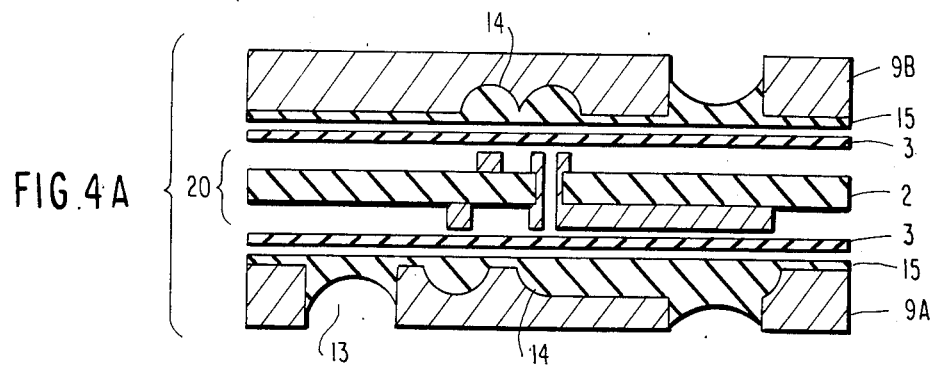
Figure 4B:
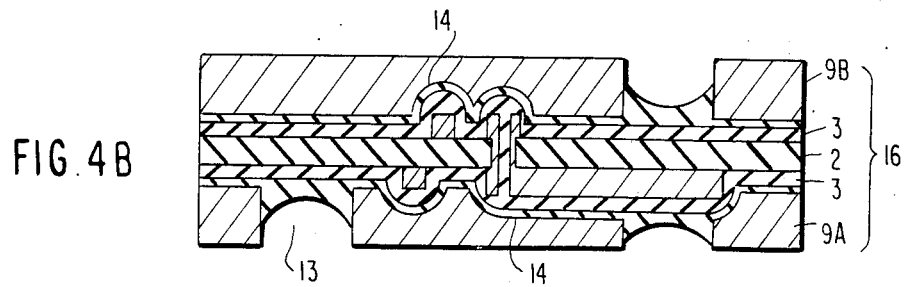

Subsequently, as shown in FIG. 4A, an internal PWB 20, which has the same structure shown in FIG. 1A, is sandwiched between the grooved conductive films 9A and 9B having the insulative resin layers 15 and prepreg sheets 3 are placed between the internal PWB 20 and the films 9A and 9B in such manner that the surfaces bearing the insulative resin layer 15 thereon are directed towards the internal PWB 20. Thereby a four-layer laminated structure 16 is obtained as shown in FIG. 4B.

Figure 4C:
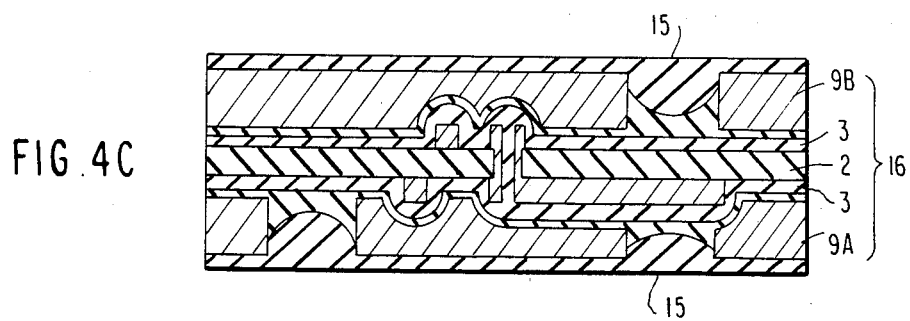
Figure 4D:
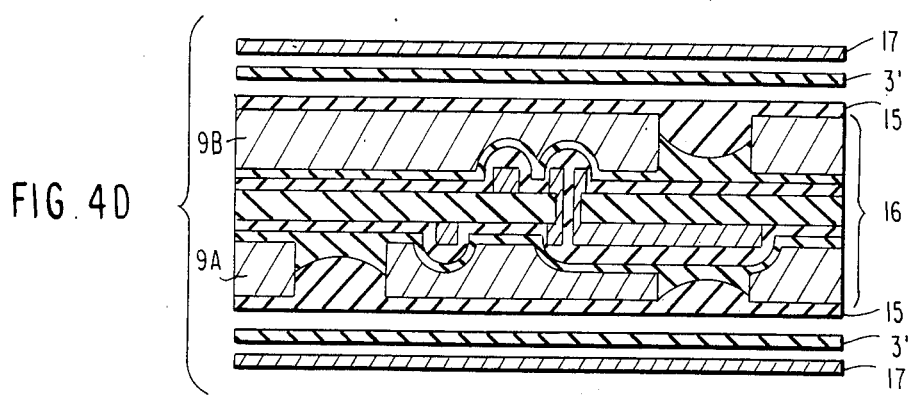
Figure 4E:
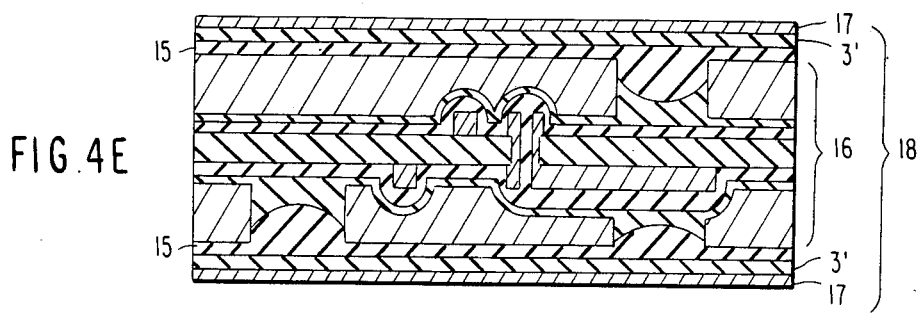

Then insulative resin layers 15 are formed on the exterior of the grooved conductive plates by means of screen printing, roll coating or the like so as to provide flat surfaces as shown in FIG. 4C. Prepreg sheets 3', and conductive thin films 17, as shown in FIG. 4D, are laminated on the flat surfaces of the four-layer structure 16 to form a flat structure 18 having six conductive layers as shown in FIG. 4E.

Figure 4F:
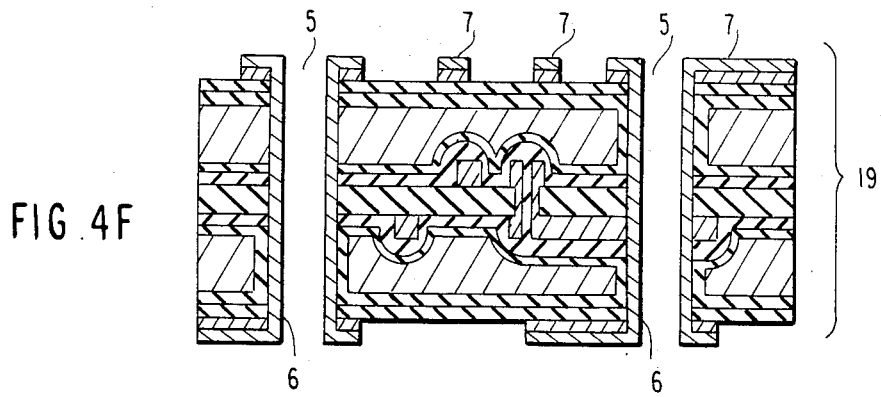

Thereafter, through-holes 5, through-hole plating layers 6 and an outer layer pattern 7 are formed in a conventional manner to provide a completed multi-layer PWB 19 as shown in FIG. 4F.

According to the present invention, since the pattern of grooves corresponds to a circuit pattern of the internal PWB 20, it is convenient to use the same photomasks used in the process of forming the circuit pattern of the internal PWB 20.

FIG. 5A shows a measured waveform of characteristic impedance of the conventional structure having an internal conductive layer with no grooves, while FIG. 5B shows the structure having the structure of the invention where grooves are provided. The characteristic impedances are measured by time domain reflectometry. The measured circuit pattern is shown in FIG. 5C. In FIG. 5A, fluctuations of about eight ohms in characteristic impedance are observed on measurement waveform corresponding to portions of land and throughhole. On the other hand, FIG. 5B shows fluctuations of about 2 ohms in characteristic impedance on measurement waveform corresponding to the same portions described above. Therefore, in this experiment, the present invention achieved the reduction of fluctuation in characteristic impedance by a factor of four over the conventional structure. The specific size of the measured experiment internal circuit pattern shown in FIG. 5C are as follows. The circuit line has averge thickness of 48 $\mu$m and width of 150 $\mu$m, while the land has a diameter of 700 $\mu$m with a through-hole diameter of 400 $\mu$m. A grooved conductive layer has a thickness of 200 $\mu$m with a groove depth of 100 $\mu$m. The width of the grooves opposing the circuit line portion is 350 $\mu$m while the grooves opposing the land portions have width of 900 $\mu$m.

FIG. 6A shows a distribution of characteristic impedances of conventional type of test boards provided with four measuring patterns as shown in FIG. 5C, while FIG. 6B shows the results for test boards build according to the present invention with the same measuring patterns shown in FIG. 5C. Each of the distributions is obtained by making a histogram with values randomly selected from 21 points on the measured characteristic impedance for each of the measuring patterns by means of time domain reflectometry.

Referring FIG. 6A, it is apparent that conventional multi-layer structure has large fluctuations of characteristic impedance and its distribution is displaced towards the low impedance region.

In contrast, according to the present invention, it is apparent from 6B, that the fluctuation of characteristic impedance is relatively small and there is no such dislocation towards the low impedance side.

According to the present invention, since the fluctuation of characteristic impedance due to lands and through-hole of internal PWB can be reduced, lands, through-holes can be freely located and thereby facilitating the design of high-density multi-layer PWB.

While the principle of the present invention has been described above in connection with one preferred embodiment, it is intended that the scope of the invention should not be limited to the illustrated embodiment but many changes and modifications can be made without departing from the spirit of the present invention.

What is claimed is:

1. A method of making a multi-layer printed wiring board comprising the steps of:
   preparing a printed wiring board having first and second circuit patterns formed on first and second principal surfaces of an insulative plate, respectively, said first and second patterns being electrically connected with each other via a through-hole formed in said insulative plate.
   forming a pair of pattern of grooves on first principal surfaces of a pair of conductive layers in such manner that said pattern of grooves correspond to the patterns of said first and second circuit patterns, respectively.
   depositing an insulating material on each of said first principal surfaces of said pair of conductive layers so as to make each of said first principal surfaces flat with said insulating material.
   sandwiching said printed wiring board between said pair of conductive layers in such manner that each of said patterns of grooves, filled with said insulating material, is opposed to a corresponding pattern of said circuit patterns before said insulating material becomes hardened,
   forming a pair of insulative layers on second principal surfaces of said pair of conductive layers, respectively,
   forming a pair of conductive thin films on said pair of insulative layers, respectively, and
   etching said pair of conductive thin films to respectively form a pair of circuit patterns.

2. A method as recited in claim 1,
   wherein said step of preparing comprises a first and a second photo-lithographic step;
   wherein said step of forming a pair of pattern of grooves comprises a third and a fourth photo-lithographic step; and
   wherein said first and third photo-lithographic steps both use a first photo-mask and said third and fourth photolithographic steps both use a second photo-mask.

3. A method as recited in claim 1, further comprising forming a pattern of through-holes in said pair conductive layers, wherein said steps of forming said pattern of grooves and of forming said pattern of through-holes comprises the steps of:
   forming an etching mask on said first principal surfaces of said pair of conductive layers corresponding to said pattern of grooves and said pattern of through-holes;
   forming an etching mask on said second principal surfaces of said pair of conductive layers corresponding to said pattern of through-holes; and
   then etching said pair of conductive layers to form said patterns of grooves and through-holes.

4. A method of making a multi-layer printed wiring board comprising the steps of:
   preparing a printed wiring board having first and second circuit patterns formed on first and second principal surfaces of an insulative plate, respectively, said first and second patterns having different shapes and being electrically connected with each other via a through-hole formed in said insulative plate,
   forming a first pattern of grooves on first principal surfaces of a first conductive layers in such manner that said first pattern of grooves corresponds only to said first circuit pattern,
   forming a second pattern of grooves on a first principal surface of a second conductive layer in such manner that said second pattern of grooves corresponds only to said second circuit pattern,
   depositing an insulating material on each of said first principal surfaces of said first and second conductive layers so as to make each of said first principal surfaces flat with said insulating material,
   sandwiching said printed wiring board between said first and second conductive layers in such a manner that each of said patterns of grooves, filled with said insulating material, is opposed to corresponding patterns of said circuit patterns before said insulating material becomes hardened, thereby embedding protruding portions of said circuit patterns into said insulating material filling said first and second grooves,
   forming a pair of insulative layers on second principal surfaces of said first and second conductive layers, respectively, and
   forming third and fourth internal circuit patterns on said pair of insulative layers, respectively.

5. A method as recited in claim 4, wherein said step of preparing comprises a first and a second photo-lithographic step;
   wherein said step of forming a pair of pattern of grooves comprises a third and a fourth photo-lithographic step; and
   wherein said first and third photo-lithographic steps both use a first photo-mask and said third and fourth photo-lithographic steps both use a second photo-mask.

6. A method as recited in claim 4, further comprising forming a pattern of through-holes in said pair of conductive layers, wherein said steps of forming said pattern of grooves and of forming said pattern of through-holes comprises the steps of:
   forming an etching mask on said first principal surfaces of said pair of conductive layers corresponding to said pattern of grooves and said pattern of through-holes;
   forming an etching mask on said second principal surfaces of said pair of conductive layers corresponding to said pattern of through-holes; and
   then etching said pair of conductive layers to form said patterns of grooves and through-holes.

* * * * *

UNITED STATES PATENT AND TRADEMARK OFFICE
CERTIFICATE OF CORRECTION

PATENT NO. : 4,668,332
DATED : May 26, 1987
INVENTOR(S) : Hidebumi Ohnuki et al

Figure 1C:
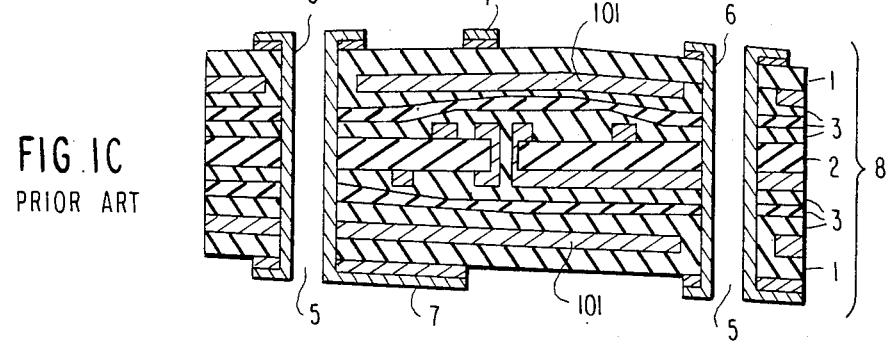

It is certified that error appears in the above-identified patent and that said Letters Patent is hereby corrected as shown below:

COLUMN 1, LINE 59   Delete "FIG. 10" insert --FIG. 1C--
COLUMN 4, LINE 16   Delete "40" insert --4D--
COLUMN 4, LINE 47   Delete "averge" insert --average--
COLUMN 4, LINE 58   Delete "build" insert --built--

Signed and Sealed this

Second Day of August, 1988

Attest:

DONALD J. QUIGG

*Attesting Officer*          *Commissioner of Patents and Trademarks*